United States Patent
Albin et al.

(10) Patent No.: US 9,419,170 B2
(45) Date of Patent: Aug. 16, 2016

(54) CONTROLLING THE STOICHIOMETRY AND DOPING OF SEMICONDUCTOR MATERIALS

(71) Applicant: Alliance for Sustainable Energy, LLC, Golden, CO (US)

(72) Inventors: David Albin, Denver, CO (US); James Burst, Lakewood, CO (US); Wyatt Metzger, Louisville, CO (US); Joel Duenow, Golden, CO (US); Stuart Farrell, Wheat Ridge, CO (US); Eric Colegrove, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 14/615,068

(22) Filed: Feb. 5, 2015

(65) Prior Publication Data

US 2015/0221810 A1  Aug. 6, 2015

Related U.S. Application Data

(60) Provisional application No. 61/936,525, filed on Feb. 6, 2014, provisional application No. 62/065,083, filed on Oct. 17, 2014.

(51) Int. Cl.
*H01L 31/18* (2006.01)
*H01L 31/0296* (2006.01)

(52) U.S. Cl.
CPC ...... *H01L 31/1828* (2013.01); *H01L 31/02963* (2013.01); *Y02P 70/521* (2015.11)

(58) Field of Classification Search
CPC ............ H01L 21/1828; H01L 31/0296; H01L 27/14696; H01L 21/0445; H01L 21/073; H01L 31/1828

USPC ............ 257/200, 614; 438/663, 914, 116, 95, 438/918
See application file for complete search history.

(56) References Cited

U.S. PATENT DOCUMENTS

| | | | | |
|---|---|---|---|---|
| 2010/0304576 | A1* | 12/2010 | Mollard | H01L 21/67109 438/796 |
| 2011/0143492 | A1* | 6/2011 | DeLuca | H01L 31/02963 438/84 |
| 2011/0155061 | A1* | 6/2011 | Chen | C23C 16/301 118/725 |
| 2013/0026465 | A1* | 1/2013 | Chang | H01L 21/823425 257/48 |

(Continued)

FOREIGN PATENT DOCUMENTS

WO  2012177804 A2  12/2012

OTHER PUBLICATIONS

Ma, et al., "Dependence of the Minority-Carrier Lifetime on the Stoichiometry of CdTe Using Time-Resolved Photoluminescense and First-Principles Calculations," Physical Review Letters, vol. 111, Issue 6, Aug. 9, 2013, pp. 067402-1-067402-5.

(Continued)

*Primary Examiner* — Jarrett Stark
*Assistant Examiner* — Shahed Ahmed
(74) *Attorney, Agent, or Firm* — Suanne C. Walts

(57) ABSTRACT

Methods for treating a semiconductor material are provided. According to an aspect of the invention, the method includes annealing the semiconductor material in the presence of a compound that includes a first element and a second element. The first element provides an overpressure to achieve a desired stoichiometry of the semiconductor material, and the second element provides a dopant to the semiconductor material.

17 Claims, 10 Drawing Sheets

(56) References Cited

U.S. PATENT DOCUMENTS

2013/0230944 A1* 9/2013 Feldman-Peabody ............ H01L 31/1828
438/94

OTHER PUBLICATIONS

Burst, et al., "Advances in Control of Doping and Lifetime in Single-Crystal and Polycrystalline CdTe", proceedings of IEEE 40th Photovoltaic Specialist Conference, Jun. 8-13, 2014, Denver, Colorado, pp. 3258-3260.

Burst, et al., "Advances in Control of Doping and Lifetime in CdTe", IEEE 40th Photovoltaic Specialist Conference, Jun. 8-13, 2014, Denver, Colorado, presentation.

Albin, et al., "Observed Stoichiometry Effects in CdTe", SunShot Thin-Film Photovoltaics Workshop, Oct. 20, 2014, University of Delaware, Newark, Delaware, presentation.

* cited by examiner

CONTROLLING THE STOICHIOMETRY AND DOPING OF SEMICONDUCTOR MATERIALS

CROSS-REFERENCE TO RELATED APPLICATIONS

This application claims priority under 35 U.S.C. §119 to U.S. Provisional Patent Application No. 61/936,525, filed on Feb. 6, 2014, and U.S. Provisional Patent Application No. 62/065,083, filed on Oct. 17, 2014, the contents of which are hereby incorporated by reference in their entireties.

CONTRACTUAL ORIGIN

The United States Government has rights in this invention under Contract No. DEAC36-08GO28308 between the United States Department of Energy and the Alliance for Sustainable Energy, LLC, the Manager and Operator of the National Renewable Energy Laboratory.

BACKGROUND OF THE INVENTION

The present invention relates to a method of treating a semiconductor material to influence its carrier concentration and carrier lifetime, as well as a semiconductor material produced by the method. II-VI semiconductor materials, such as CdTe, have been used in a variety of applications, such as photovoltaics, infrared detectors, and focal plane arrays. For example, laboratory experiments have demonstrated CdTe photovoltaic (PV) cells having an efficiency of 21%. However, it would be advantageous to improve this efficiency, in order to reduce the costs of energy produced by CdTe PV cells.

SUMMARY OF THE INVENTION

Exemplary embodiments of the invention provide methods for treating a semiconductor material. According to an aspect of the invention, the method includes annealing the semiconductor material in the presence of a compound that includes a first element and a second element. The first element provides an overpressure to achieve a desired stoichiometry of the semiconductor material, and the second element provides a dopant to the semiconductor material.

A vapor pressure of the semiconductor material may be lower than a vapor pressure of the compound. Further, a vapor pressure of the first element may be lower than a vapor pressure of the second element.

The semiconductor material may be CdTe or an alloy of CdTe, the first element may be Cd, and the stoichiometry may be Cd-rich. The second element may be selected from Column VA of the periodic table. For example, the second element may be P, As, or Sb. The compound may be $Cd_3P_2$.

Alternatively, the semiconductor material may be CdTe or an alloy of CdTe, the first element may be Te, and the stoichiometry may be Te-rich. The second element may be selected from Column IB of the periodic table. For example, the second element may be Cu, Ag, or Au.

The semiconductor material may be CdTe or an alloy of CdTe, and the annealing may be performed at a temperature greater than approximately 600° C., or at a temperature greater than approximately 700° C.

The method may also include subsequently annealing the treated semiconductor material in the presence of the first element, which may be Cd. The subsequent annealing may be performed at a first temperature between approximately 300° C. and approximately 600° C. The method may also include heating the treated and subsequently annealed semiconductor material at a second temperature that is lower than the first temperature, and in the presence of ambient materials that promote at least one of annihilation or re-evaporation of excess quantities of the first element from the semiconductor material.

According to another aspect of the invention, a semiconductor material including doped CdTe is provided. The semiconductor material has a carrier concentration greater than approximately $10^{16}$ cm$^{-3}$ and a carrier lifetime greater than approximately 25 ns. The CdTe may be doped with P. The carrier concentration of the semiconductor material may be stable for at least 100 days.

Other objects, advantages, and novel features of the present invention will become apparent from the following detailed description of the invention when considered in conjunction with the accompanying drawings.

DETAILED DESCRIPTION OF EXEMPLARY EMBODIMENTS

Figure 1:
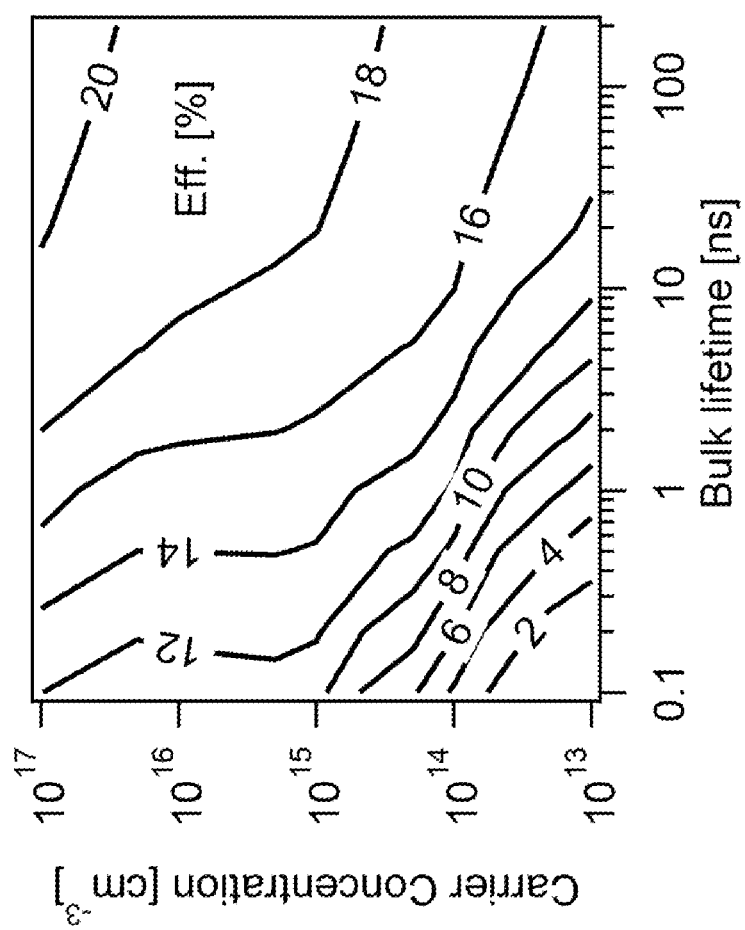
FIG. 1 shows the efficiency of a CdTe PV cell as a function of the carrier concentration and the carrier lifetime of the CdTe absorber layer.

Exemplary embodiments of the present invention provide a method of treating a semiconductor material, such as a II-VI semiconductor material, in an effort to improve the performance of devices incorporating the semiconductor material. For example, as shown in FIG. 1, the efficiency of a CdTe PV cell depends on the carrier concentration and the carrier lifetime of the CdTe absorber layer. For related art polycrystalline CdTe materials, the carrier concentration has typically been in the range of $10^{13}$-$10^{14}$ cm$^{-3}$ and the carrier lifetime has typically been limited to several ns. In contrast, exemplary embodiments of the present invention control the stoichiometry and the doping of semiconductor materials, such as CdTe, in order to increase the carrier concentration and/or the carrier lifetime. Advantageously this may result in a CdTe PV cell having a higher efficiency, as well as a higher open-circuit voltage and a higher fill factor.

Figure 2:
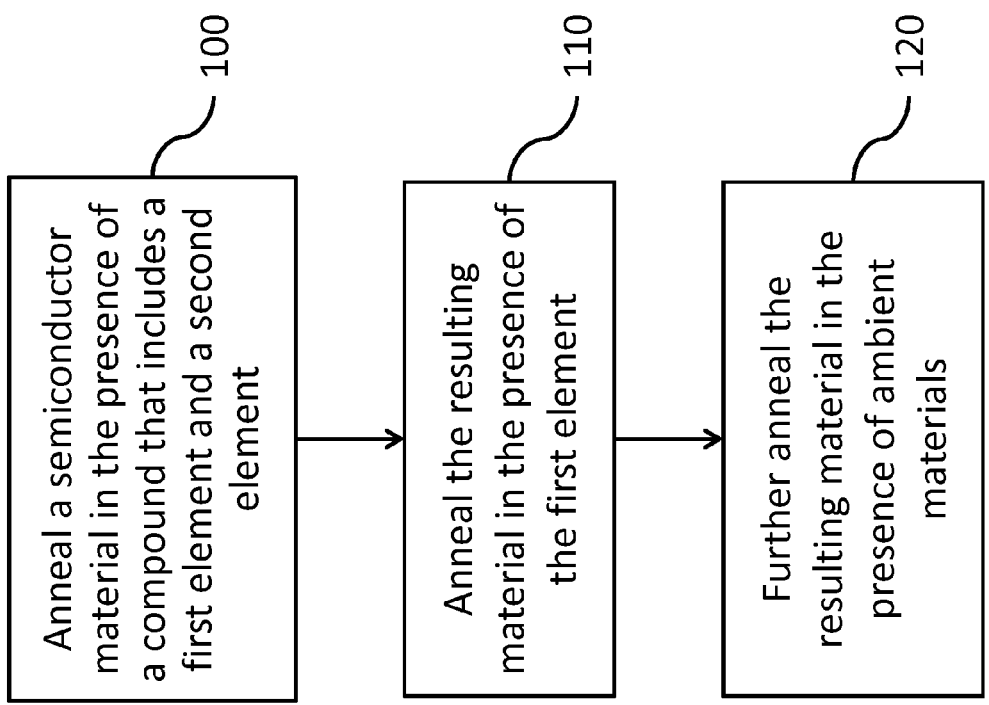
FIG. 2 shows a flowchart of an exemplary embodiment of a method for treating a semiconductor material that has already been formed.

FIG. 2 shows a flowchart of an exemplary embodiment of a method for treating a semiconductor material that has already been formed as a bulk material or deposited on a substrate. As shown in FIG. 2, the method begins at step 100 by annealing the semiconductor material in the presence of a compound that includes a first element and a second element. The compound is used both to control the stoichiometry of the semiconductor material and to supply an extrinsic dopant to the semiconductor material. Specifically, the first element of the compound provides an overpressure to achieve the desired stoichiometry, while the second element of the compound provides the dopant. The first element of the compound facilitates a higher incorporation of the second element of the compound into the semiconductor material.

The semiconductor material may be annealed in the presence of any suitable compound. Examples of suitable dopants to be used as the second element are discussed in WO 2012/177804, the contents of which are hereby incorporated by reference. WO 2012/177804 discloses a method of producing polycrystalline CdTe materials and devices with increased carrier concentration and/or carrier lifetime by depositing a source material including an amount of Cd and an amount of Te in a non-stoichiometric ratio. If the ratio of Cd to Te is greater than one, the stoichiometry is Cd-rich, whereas if the ratio of Cd to Te is less than one, the stoichiometry is Te-rich. The source material of WO 2012/177804 may also include a dopant, which is an element other than Cd or Te. WO 2012/177804 discloses the use of various deposition methods to produce a CdTe layer, such as physical vapor deposition (PVD), close-space sublimation (CSS), or vapor transport deposition (VTD).

In contrast with WO 2012/177804, exemplary embodiments of the present invention treat a single-crystal or polycrystalline semiconductor material after it has been formed. There are no constraints on how the semiconductor material is deposited, or on the composition of the semiconductor material. According to exemplary embodiments of the present invention, the previously formed semiconductor material may be annealed by any suitable method, such as heating the semiconductor material in a pressurized quartz ampoule that contains the compound including the first element and the second element.

In one exemplary embodiment, CdTe is annealed in the presence of a compound that includes Cd as the first element to achieve a Cd-rich stoichiometry. The compound may include a second element selected from Column VA of the periodic table, such as P, As, or Sb, in order to dope the CdTe. Accordingly, the CdTe may be annealed in the presence of a compound such as $Cd_3P_2$, $Cd_3As_2$, or $Cd_3Sb_2$. The resulting material will have p-type conductivity.

In another exemplary embodiment, CdTe is annealed in the presence of a compound that includes Te as the first element to achieve a Te-rich stoichiometry. The compound may include a second element selected from Column IB of the periodic table, such as Cu, Ag, or Au, in order to dope the CdTe. Accordingly, the CdTe may be annealed in the presence of a compound such as CuTe, $Cu_{1.4}Te$, $Cu_2Te$, or $Ag_2Te$. Again, the resulting material will have p-type conductivity.

Figure 3:
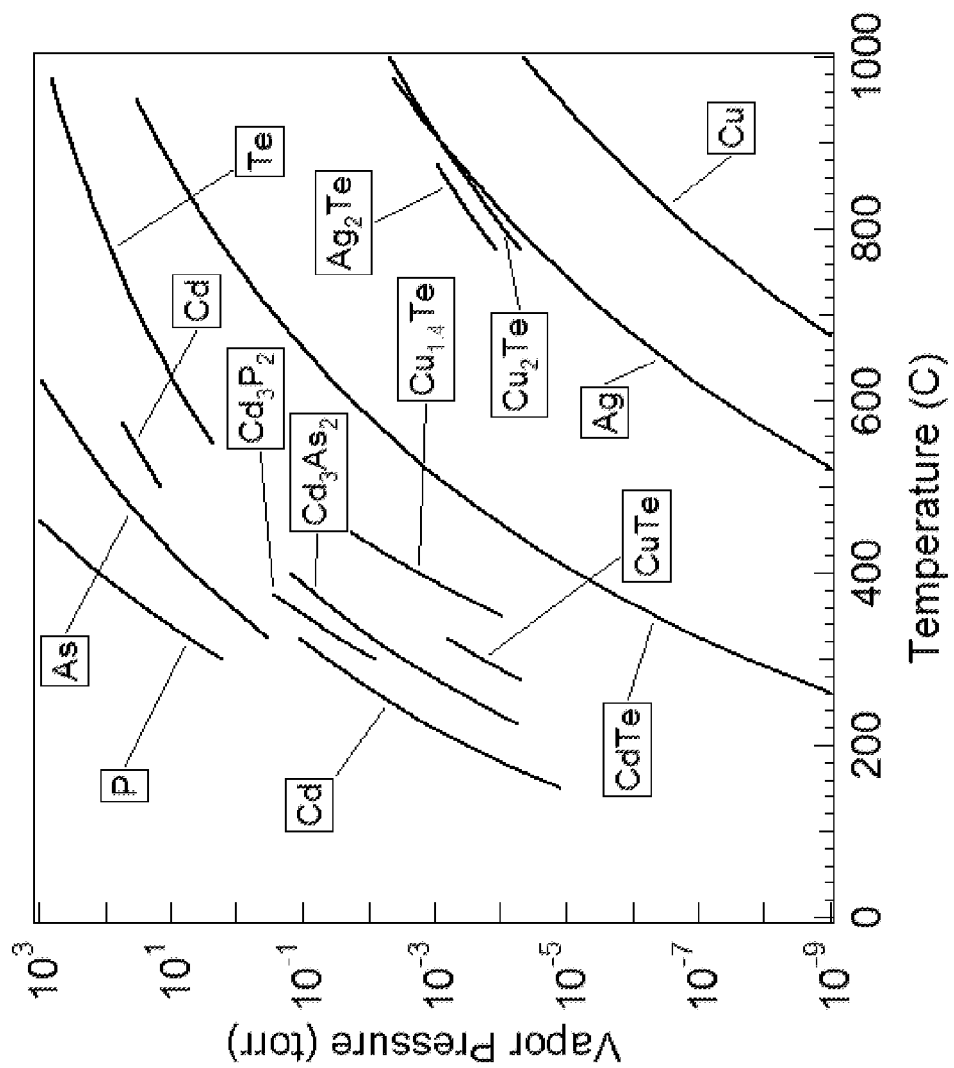
FIG. 3 shows vapor pressure curves for various elements and compounds.

The compound may be selected to have a vapor pressure that is higher than the vapor pressure of the semiconductor material. For example, if a CdTe film is annealed in close proximity to the compound, it is desirable for the vapor pressure of the compound to be higher than the vapor pressure of the CdTe, to prevent the CdTe from vaporizing at a rate that is greater than the doping of the material. As shown in FIG. 3, compounds that lie to the left of the vapor pressure curve for CdTe, such as $Cd_3P_2$, $Cd_3As_2$, CuTe, and $Cu_{1.4}Te$, may advantageously be selected. These compounds are more volatile than CdTe and therefore reduce the exposure of CdTe to heat.

Further, the second element may be selected to have a vapor pressure that is higher than the vapor pressure of the first element. For example, FIG. 3 shows that the vapor pressure of Cu is many orders of magnitude lower than the vapor pressure of Te. Therefore, it may be difficult to maintain the chemical potential of Te while doping the CdTe with Cu. On the other hand, both P and As have a higher vapor pressure than Cd. Accordingly, it may be easier to maintain the chemical potential of Cd while doping the CdTe with P or As.

Figure 4B:
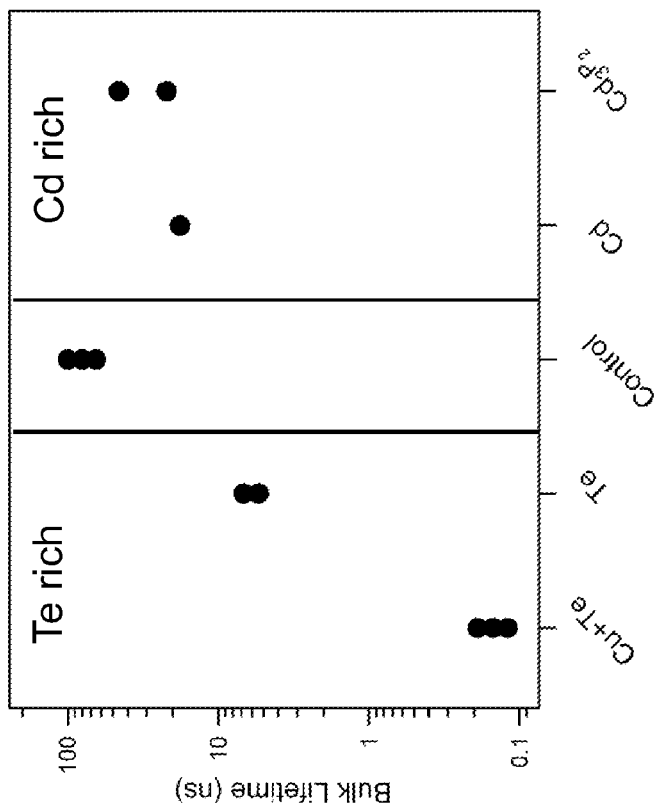
FIGS. 4A and 4B show experimental results of the carrier concentration and the carrier lifetime of annealed single-crystal CdTe wafers, respectively.
Figure 4A:
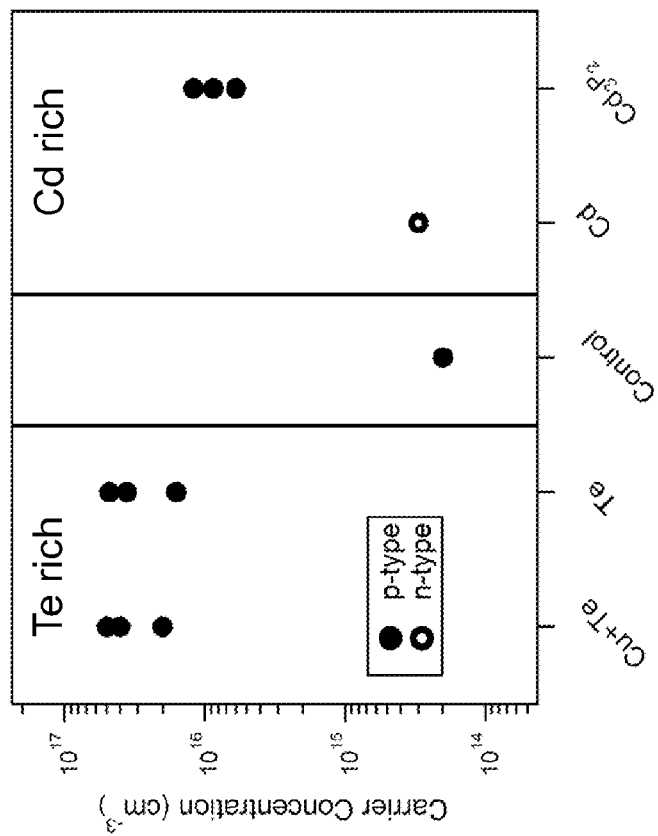

FIG. 4A shows a comparison of experimental results of the carrier concentration of annealed single-crystal CdTe wafers. The left-hand side of FIG. 4A shows the results for a Te-rich stoichiometry. The data points labeled "Cu+Te" were obtained with a first low-temperature furnace anneal in the presence of Cu, followed by a second higher-temperature ampoule anneal in the presence of Te. The data points labeled "Te" were obtained by annealing CdTe in the presence of Te alone. The right-hand side of FIG. 4A shows the results for a Cd-rich stoichiometry. The data points labeled "Cd" were obtained by annealing CdTe in the presence of Cd alone, and the data points labeled "$Cd_3P_2$" were obtained by annealing CdTe in the presence of $Cd_3P_2$. The middle of FIG. 4A shows a control in which the CdTe wafer was not annealed. All of the resulting materials are p-type except for the sample annealed only in the presence of Cd, which is converted by the Cd-only ambient to be n-type. FIG. 4A shows that for all of the p-type materials, the carrier concentration is increased by approximately two orders of magnitude, as compared to the control that was not annealed.

FIG. 4B shows a comparison of experimental results of the carrier lifetime of annealed single-crystal CdTe wafers. The left-hand side of FIG. 4B shows the results for a Te-rich stoichiometry, while the right-hand side of FIG. 4B shows the results for a Cd-rich stoichiometry. The annealing conditions for the various data points were described above with regard to FIG. 4A. FIG. 4B shows that the carrier lifetime decreased slightly for the samples with a Cd-rich stoichiometry, and decreased significantly for the samples with a Te-rich stoichiometry, as compared to the control that was not annealed.

In the examples shown in FIGS. 4A and 4B, the control has a high lifetime of approximately 70-90 ns and a low carrier concentration of approximately $10^{14}$ $cm^{-3}$. By annealing the CdTe wafer in the presence of the compound $Cd_3P_2$, both a high carrier concentration of approximately $10^{16}$ $cm^{-3}$ and a high lifetime of approximately 20-50 ns can be obtained simultaneously. In this case, the lower vapor pressure of the Cd relative to the P maintains the Cd-rich stoichiometry required to adequately incorporate the P. At the same time, the stoichiometry is pushed towards a Cd-rich stoichiometry in order to maintain the lifetime to a large extent. As discussed above, this combination of a high carrier concentration and a high lifetime results in an increased efficiency of a PV cell incorporating the CdTe material.

Figure 5B:
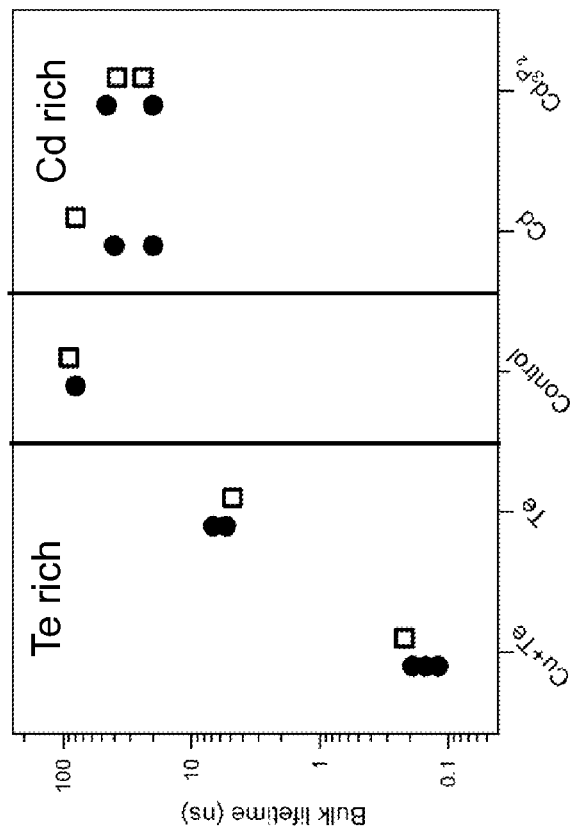
FIGS. 5A and 5B show experimental results of the carrier concentration and the carrier lifetime of annealed single-crystal CdTe wafers and large-grain polycrystalline CdTe wafers, respectively.
Figure 5A:
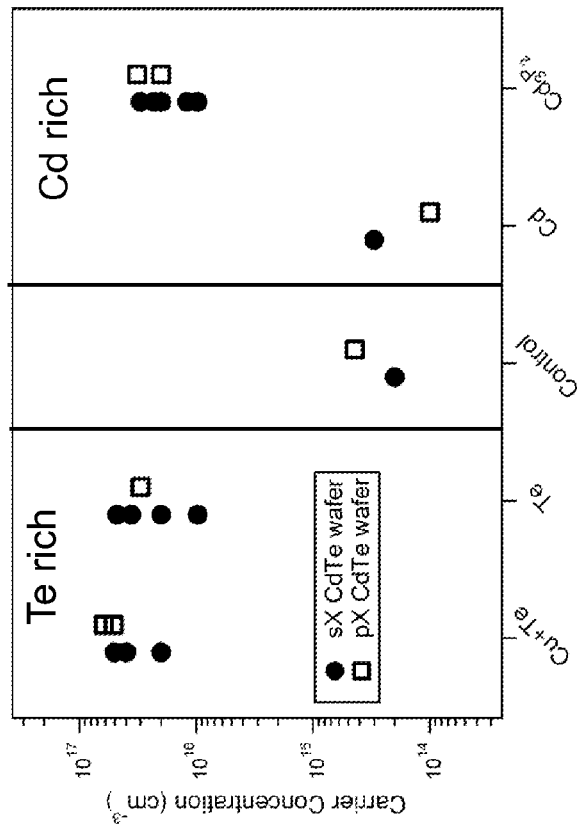

FIGS. 5A and 5B show similar results in which the circular data points represent single-crystal bulk CdTe wafers and the square data points represent large-grain polycrystalline bulk CdTe wafers. These data suggest that the presence of several grain boundaries in the large-grain (~100-1000 µm) polycrystalline wafers do not limit the bulk carrier concentration. Further, Hall effect mobility values were maintained in the range of 60-80 $cm^2$/V-s for all samples, which is equivalent to the values prior to annealing. Thus, variations in the carrier concentration from $10^{14}$-$10^{16}$ cm$^{-3}$ using Cu, P, and Cd-vacancy dopants do not limit mobility in single crystals or in large-grain polycrystals. Accordingly, the methods described herein may be used with either single-crystal or polycrystalline CdTe bulk materials.

Figure 6:
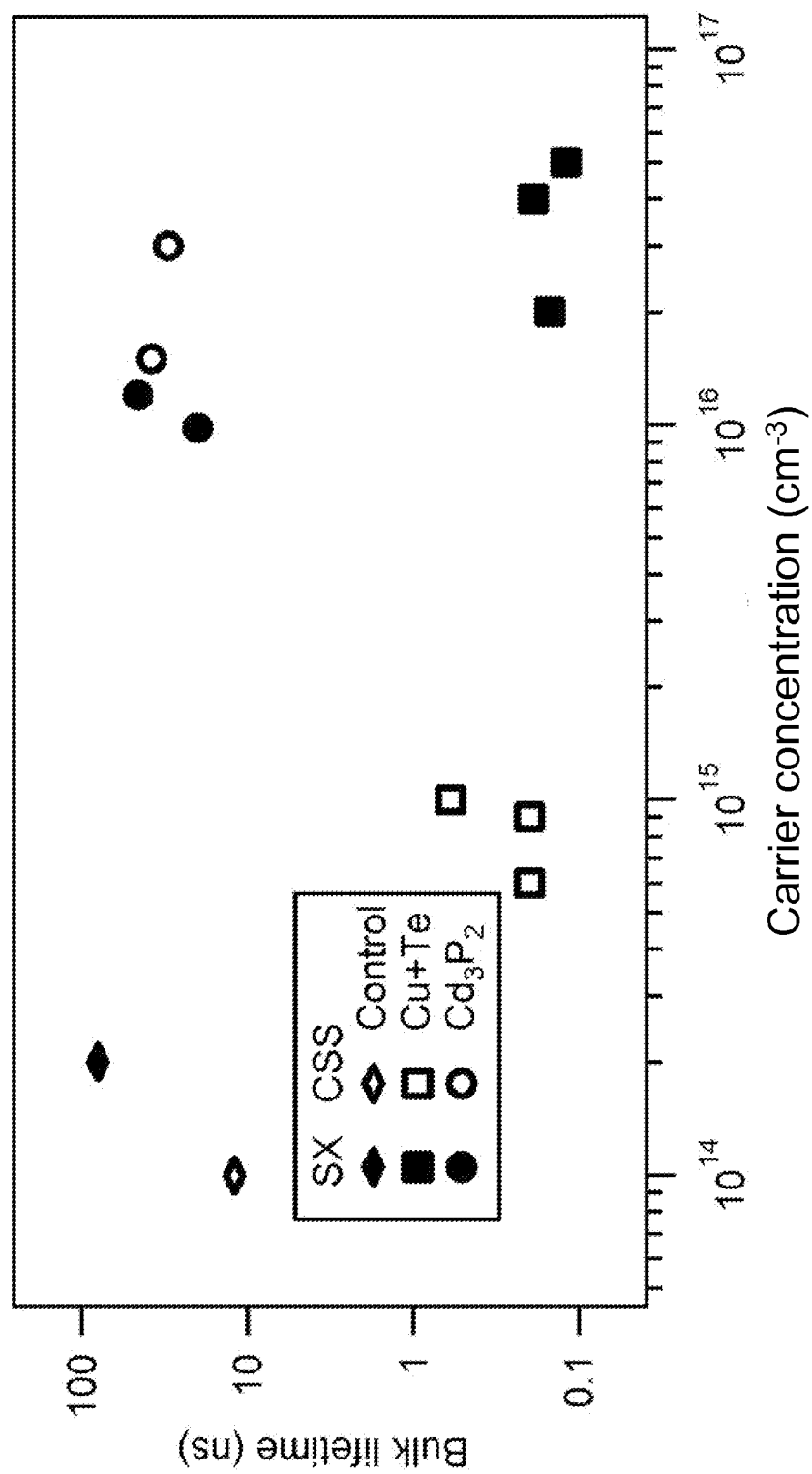
FIG. 6 shows the carrier concentration and the bulk lifetime for single-crystal CdTe wafers and polycrystalline CdTe films grown by close-space sublimation (CSS)

Further, the methods described herein may be used with polycrystalline films grown by high deposition rate CSS. These films typically have a grain size of 20-100 µm, and include a large number of extended defects. In an exemplary embodiment, the CSS CdTe films do not include Cl, Cu, S, or intentionally added O. FIG. 6 shows a comparison of the carrier concentration and the bulk lifetime for single-crystal CdTe wafers and polycrystalline CSS CdTe films. In this example, the single-crystal CdTe wafers had a thickness of approximately 800 µm, and the polycrystalline CSS CdTe films had a thickness of approximately 100 µm. For the data points in which the CdTe material was annealed in the presence of $Cd_3P_2$, the single-crystal CdTe wafers were annealed for two hours at a temperature of approximately 725° C., and the polycrystalline CSS CdTe films were annealed for two hours at a temperature of approximately 700° C. For the data points in which the CdTe material was annealed in the presence of Cu and Te, the single-crystal CdTe wafers were annealed for two hours at a temperature of approximately 700° C., and the polycrystalline CSS CdTe films were annealed for two hours at a temperature of approximately 650° C. However, any suitable temperature and duration may be used. In particular, it may be advantageous to use a lower temperature to anneal thinner polycrystalline CSS CdTe films. For example, polycrystalline CSS CdTe films with a thickness less than approximately 25 µm may be annealed in the presence of $Cd_3P_2$ for one to fifteen minutes at a temperature of approximately 625° C. to approximately 700° C.

In the example shown in FIG. 6, the control film had a carrier concentration of approximately $10^{14}$ cm$^{-3}$ and a lifetime of approximately 10 ns. As shown in FIG. 6, both the carrier concentration and the carrier lifetime of CSS CdTe films increased significantly when annealed in the presence of $Cd_3P_2$. Specifically, the treated CSS CdTe films have been shown to have a carrier concentration greater than $10^{16}$ cm$^{-3}$ and a lifetime greater than 25 ns. These values are similar to the results achieved for the CdTe single-crystal wafers.

Figure 7:
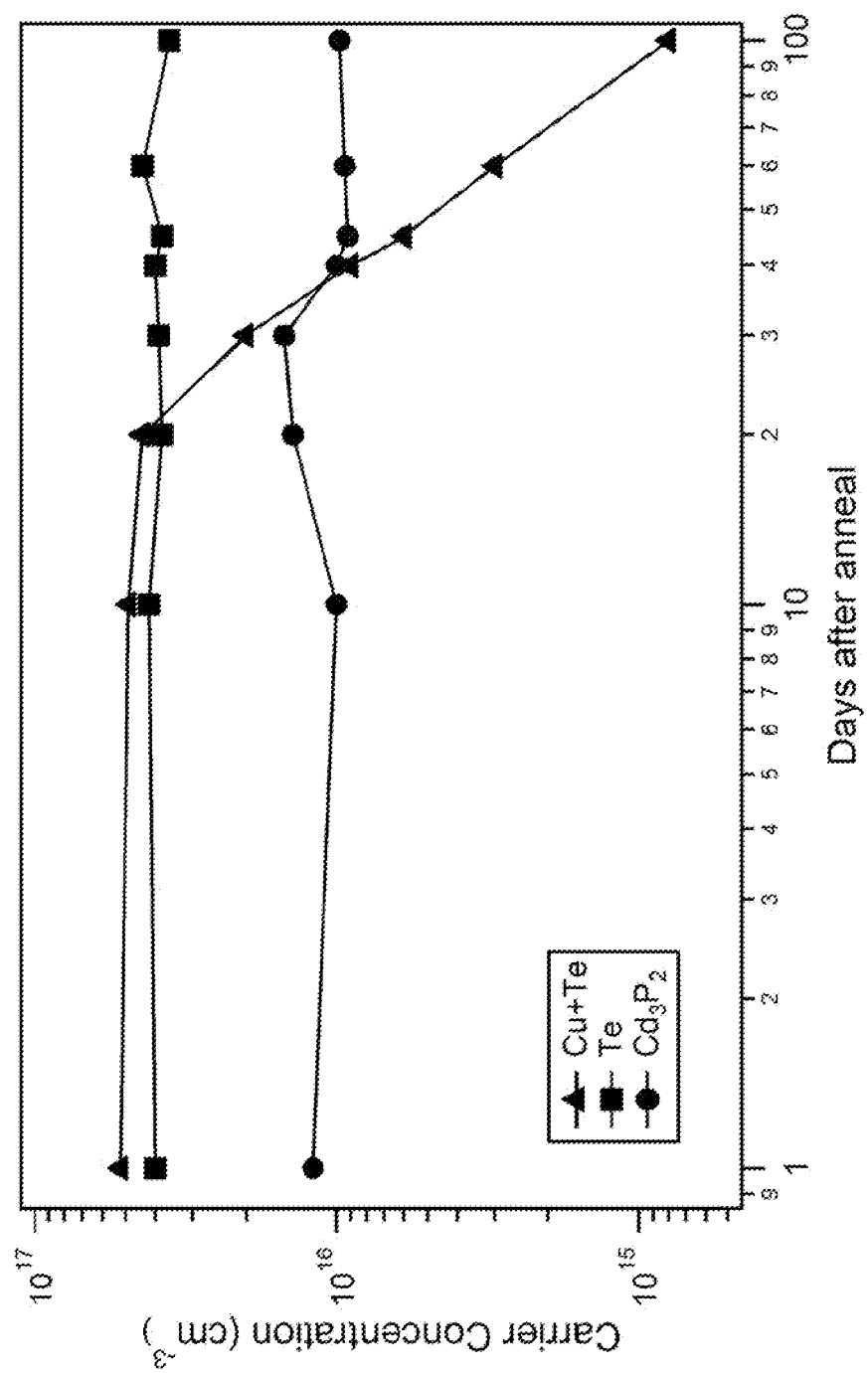
FIG. 7 shows the carrier concentration as a function of time for single-crystal CdTe wafers that are annealed in the presence of different materials.
Figure 8:
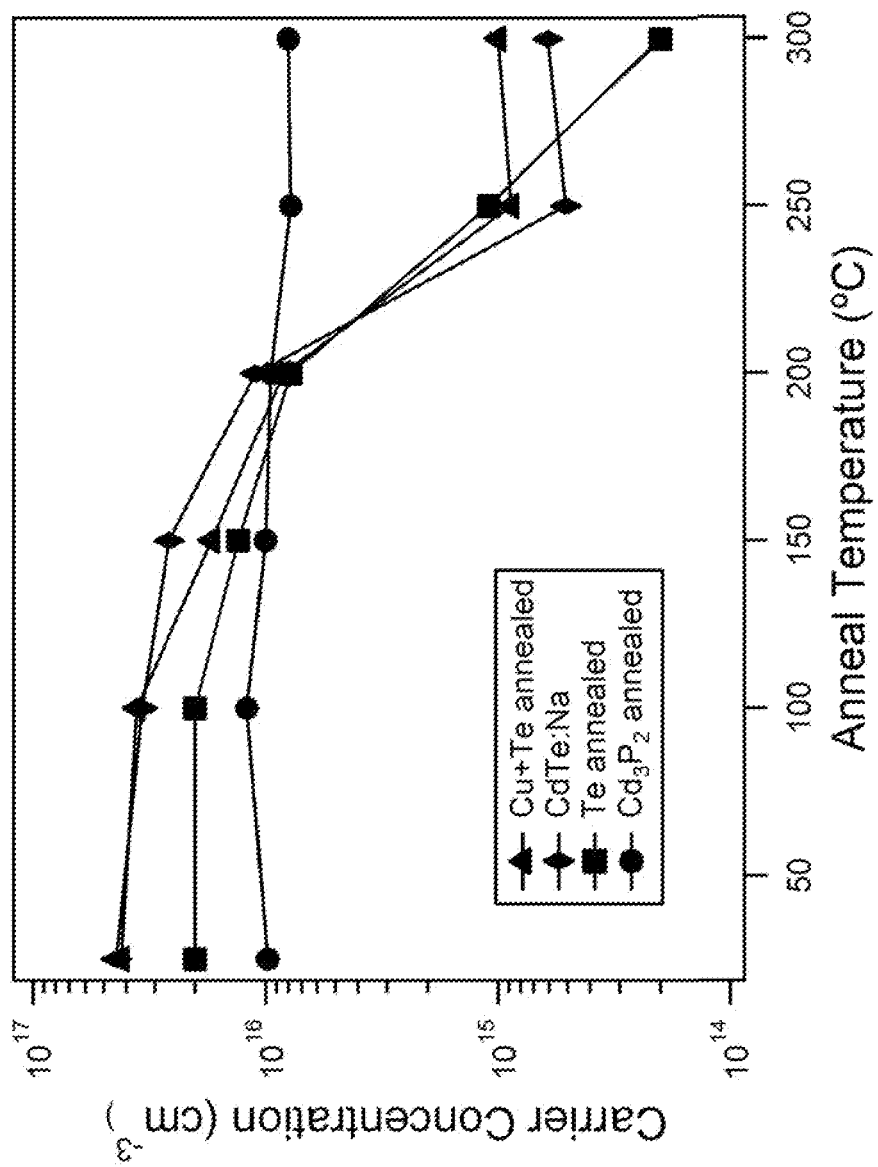
FIG. 8 shows the carrier concentration as a function of subsequent anneal temperature for treated single-crystal CdTe wafers.

In addition to achieving a high carrier concentration and a high carrier lifetime, it is also advantageous for the defect chemistry of the semiconductor material to be stable. As shown in FIG. 7, the carrier concentration of single-crystal CdTe material that is annealed in the presence of $Cd_3P_2$ at step 100 is stable for at least 100 days. Further, FIG. 8 shows that the carrier concentration of single-crystal CdTe material that is annealed in the presence of $Cd_3P_2$ at step 100 is stable over a wide range of subsequent anneal temperatures. For example, after being annealed at step 100 in the presence of the materials identified in the legend of FIG. 8, various CdTe samples were heated in an inert atmosphere to evaluate their stability. The carrier concentration of the CdTe samples that were annealed in the presence of $Cd_3P_2$ was stable through a subsequent anneal temperature of at least 300° C.

In various embodiments, CdTe may be annealed at step 100 at temperatures between approximately 200° C. and approximately 900° C. Advantageously the annealing may be performed at high temperatures, such as greater than approximately 600° C., in order to reduce the annealing time. In both single-crystal materials and polycrystalline thin films, evaporation and deleterious film morphology changes are reduced when the material is annealed in Cd-rich vapors, instead of vacuum or Te-rich vapors. This is particularly important for thin films, in which slight evaporation or morphology changes of the CdTe material can destroy the entire film. For example, 4 µm polycrystalline CdTe films can be annealed at temperatures of 620° C. for long periods of time without re-evaporation when Cd overpressures are used. For bulk materials, annealing with Cd up to 700° C. results in no observable loss of CdTe. Alternatively, CdTe may be annealed at temperatures below approximately 500° C. at higher pressures. Such lower temperatures allow for the use of a glass material to enclose the space in which the CdTe is annealed in the presence of the compound. CdTe may be annealed at any suitable pressure, such as vacuum (less than 100 torr) to approximately 760 torr or higher.

In addition to CdTe, the methods described herein may be applied to CdTe alloys, such as CdZnTe, in which the anion may be Cd or may be substituted partially or entirely with Zn. The methods described herein may also be applied to any II-VI semiconductor material. Further, the principles of the present invention could be extended to other compound semiconductor materials.

As shown in FIG. 2, in some exemplary embodiments of the present invention, additional steps may be taken to improve the activation of the dopant in the semiconductor material. For example, if a polycrystalline CSS CdTe thin film is annealed in the presence of $Cd_3P_2$ at step 100, the P dopant may not entirely occupy the desired lattice positions, such that measured values of the carrier concentration may be lower than expected. Accordingly, exemplary embodiments of the present invention may further anneal the treated semiconductor material in the presence of the first element at step 110. For example, the treated polycrystalline CdTe thin film may be annealed in the presence of Cd at moderately high temperatures, such as within a range of approximately 300° C. to approximately 600° C., at which the formation of $P_{Te}$ defects is favored.

Figure 9B:
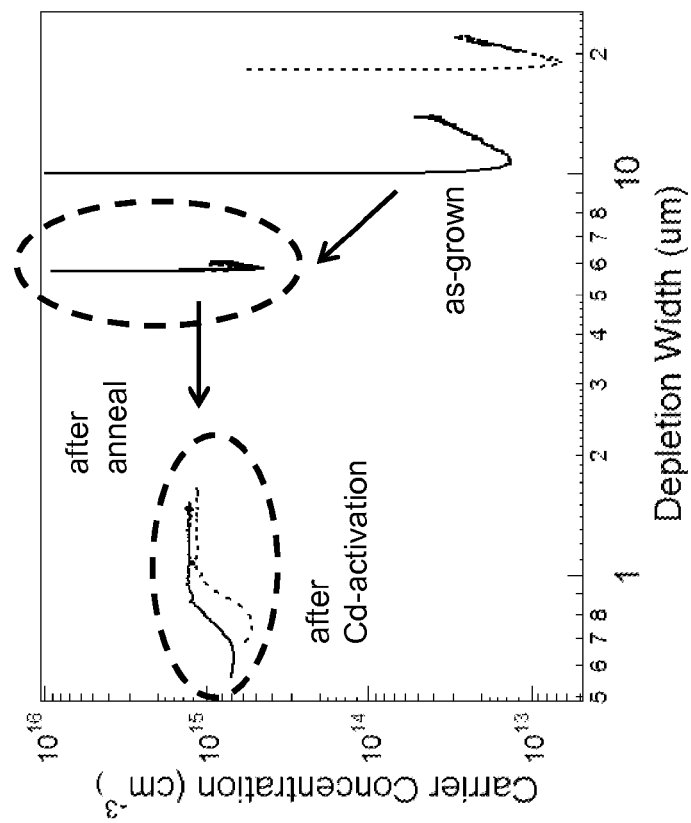
FIGS. 9A and 9B show an example in which a polycrystalline CSS CdTe thin film is first annealed in the presence of $Cd_3P_2$ and subsequently annealed in the presence of Cd.
Figure 9A:
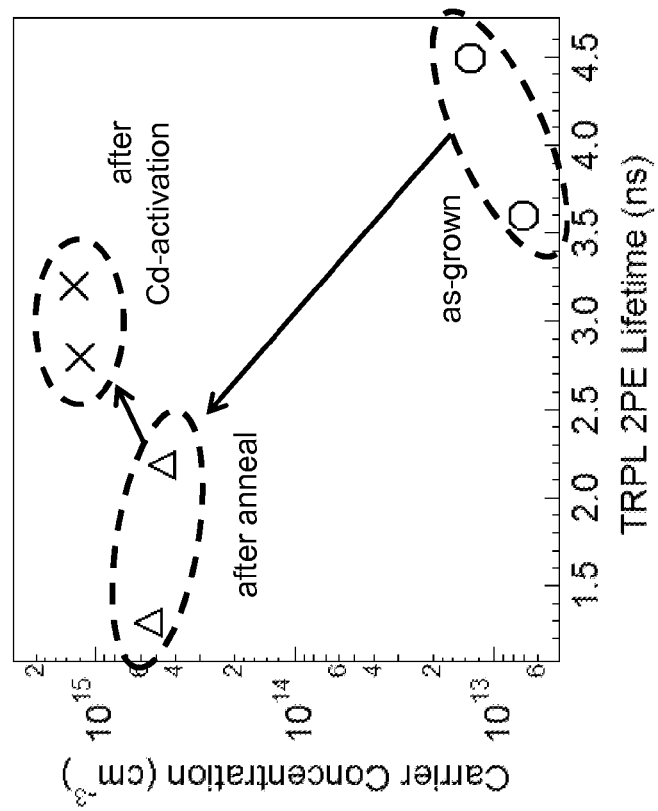

FIGS. 9A and 9B show an example in which a polycrystalline CSS CdTe thin film is annealed in the presence of $Cd_3P_2$ at step 100. As shown in FIG. 9A, the initial carrier concentration in the previously deposited CdTe film is approximately $10^{13}$ cm$^{-3}$ (labeled as "as-grown" in FIG. 9A). After annealing the CdTe film at 675° C. in the presence of $Cd_3P_2$ at step 100, the carrier concentration is increased to approximately $6 \times 10^{14}$ cm$^{-3}$ (labeled as "after anneal" in FIG. 9A). However, as shown in FIG. 9B, the depletion width remains large (~6 µm), indicating a low level of dopant activation. The treated CdTe film is then annealed again at a moderate temperature of 470° C. in the presence of Cd at step 110, which increases the carrier concentration above $10^{15}$ cm$^{-3}$ (labeled as "after Cd-activation" in FIG. 9A). As shown in FIG. 9B, there is also a corresponding decrease in the depletion width, confirming an increase in the dopant activation within the CdTe film.

Figure 10A:
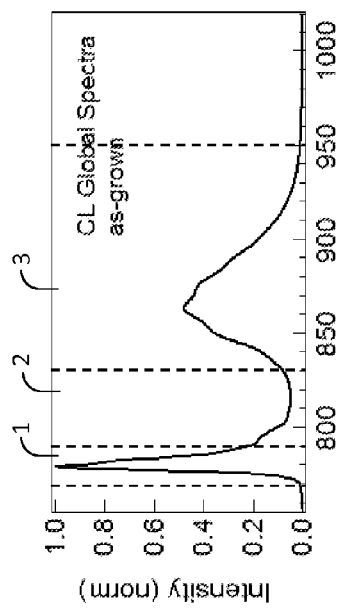
FIGS. 10A-10C show emission spectra obtained for different states of a polycrystalline CSS CdTe thin film.
Figure 10B:
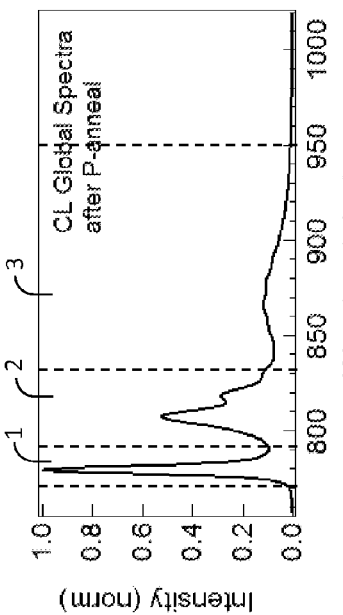
Figure 10C:
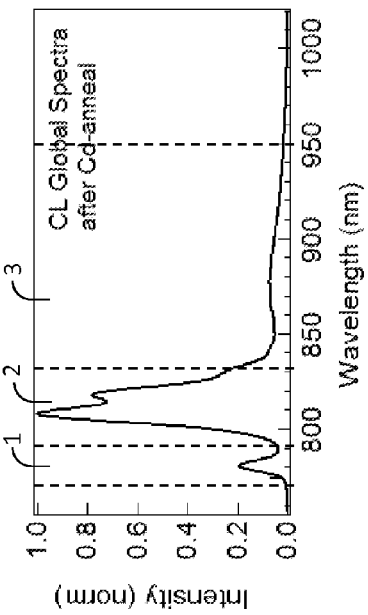

In order to study the incorporation of P into a polycrystalline CdTe thin film, samples from a single film were analyzed by cathodoluminescense spectral imaging (CLSI) in the as-grown, after anneal, and after Cd-activation states. FIG. 10A shows the spectrum obtained for the as-grown state, FIG. 10B shows the spectrum obtained for the after anneal state, and FIG. 10C shows the spectrum obtained for the after Cd-activation state. Areas 1, 2, and 3 correspond to luminescence from excitonic, point, and extended defects, respectively. Area 2 specifically indicates emission from activated P. FIGS. 10A-10C show that the phosphorous peak is absent in the as-grown state, begins to appear in the after anneal state, and dominates the spectrum in the after Cd-activation state. This demonstrates that the incorporation of P is facilitated by the Cd-activation in step 110.

As shown in FIG. 2, exemplary embodiments of the invention may follow the moderate temperature Cd-anneal of step 110 with an additional annealing step in the presence of ambient materials at step 120, in order to increase the carrier concentration by reducing the presence of compensating defects. The carrier concentration can be increased by increasing the concentration of favored $P_{Te}$ defects and decreasing the concentration of defects that would introduce n-type conduction in the CdTe. In this example, the major compensating defect would be Cd-interstitials, often written as $Cd_i$. Because Cd has a higher diffusivity than P, and $P_{Te}$ defects are generally quite stable, the additional annealing at step 120 at a lower temperature in ambients that promote the annihilation or re-evaporation of excess Cd can reduce compensation and further increase the carrier concentration. The additional annealing step may be performed in the presence of any suitable ambient materials, such as nitrogen ($N_2$) and vacuum. Further, the additional annealing step may be performed at any suitable temperature, such as from approximately 400° C. to approximately 500° C.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of treating a semiconductor material, the method comprising:
   annealing the semiconductor material in the presence of a compound that includes a first element and a second element; wherein:
   the first element provides a vapor overpressure to achieve a desired stoichiometry of the semiconductor material, wherein the stoichiometry is a ratio of components of the semiconductor material, and
   the second element provides a dopant to the semiconductor material.

2. The method according to claim 1, wherein a vapor pressure of the semiconductor material is lower than a vapor pressure of the compound.

3. The method according to claim 1, wherein a vapor pressure of the first element is lower than a vapor pressure of the second element.

4. The method according to claim 1, wherein the semiconductor material is CdTe or an alloy of CdTe, the first element is Cd, and the stoichiometry is Cd-rich.

5. The method according to claim 4, wherein the second element is selected from Column VA of the periodic table.

6. The method according to claim 4, wherein the second element is P, As, or Sb.

7. The method according to claim 4, wherein the second element is P.

8. The method according to claim 4, wherein the compound is $Cd_3P_2$.

9. The method according to claim 1, wherein the semiconductor material is CdTe or an alloy of CdTe, the first element is Te, and the stoichiometry is Te-rich.

10. The method according to claim 9, wherein the second element is selected from Column IB of the periodic table.

11. The method according to claim 9, wherein the second element is Cu, Ag, or Au.

12. The method according to claim 1, wherein the semiconductor material is CdTe or an alloy of CdTe, and the annealing is performed at a temperature greater than approximately 600° C.

13. The method according to claim 1, wherein the semiconductor material is CdTe or an alloy of CdTe, and the annealing is performed at a temperature greater than approximately 700° C.

14. The method according to claim 1, further comprising subsequently annealing the treated semiconductor material in the presence of the first element.

15. The method according to claim 14, wherein the first element is Cd.

16. The method according to claim 14, wherein the subsequent annealing is performed at a first temperature between approximately 300° C. and approximately 600° C.

17. The method according to claim 16, further comprising heating the treated and subsequently annealed semiconductor material at a second temperature that is lower than the first temperature, and in the presence of ambient materials that promote at least one of annihilation or re-evaporation of excess quantities of the first element from the semiconductor material.

* * * * *